US011069395B2

(12) United States Patent
Bayat et al.

(10) Patent No.: US 11,069,395 B2
(45) Date of Patent: Jul. 20, 2021

(54) ANALOG-TO-DIGITAL CONVERTER FOR NON-VOLATILE MEMORY ARRAYS USED FOR IN-MEMORY COMPUTATION WITH FLOATING BITLINES

(71) Applicant: MENTIUM TECHNOLOGIES INC., Santa Barbara, CA (US)

(72) Inventors: Farnood Merrikh Bayat, Santa Barbara, CA (US); Jaroslaw Sulima, Santa Barbara, CA (US); Mirko Prezioso, Santa Barbara, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 0 days.

(21) Appl. No.: 16/932,249

(22) Filed: Jul. 17, 2020

(65) Prior Publication Data

US 2021/0020228 A1 Jan. 21, 2021

Related U.S. Application Data

(60) Provisional application No. 62/875,066, filed on Jul. 17, 2019.

(51) Int. Cl.
*G11C 11/4074* (2006.01)
*G11C 11/4091* (2006.01)
(Continued)

(52) U.S. Cl.
CPC .... *G11C 11/40626* (2013.01); *G01R 19/0038* (2013.01); *G01R 19/10* (2013.01);
(Continued)

(58) Field of Classification Search
CPC . G11C 11/40626; G11C 5/025; G11C 7/1096; G11C 11/4074; G11C 11/4091;
(Continued)

(56) References Cited

U.S. PATENT DOCUMENTS 6,687,165 B1 2/2004 Cioaca
6,765,560 B1 * 7/2004 Ozawa ................ G09G 3/2011
345/204

(Continued)

OTHER PUBLICATIONS

PCT International Search Report and Written Opinion issued in corresponding Application No. PCT/US2020/042666, dated Nov. 20, 2020.
(Continued)

*Primary Examiner* — Ly D Pham
(74) *Attorney, Agent, or Firm* — Maschoff Brennan

(57) ABSTRACT

Systems and methods with analog to digital converters are provided. The systems and methods may include a plurality of non-volatile memory cells that may be organized into an array. A bitline may be electrically coupled to a column of memory cells vertically arranged in the array. The bitline may be configured to sum up the current produced by the memory cells in the column. A digital-to-analog converter having an output electrically coupled to the bitline may be configured to generate a current and add it through the output to the bitline. A voltage comparator having an input that is electrically coupled to the bitline may be configured to measure a voltage on the bitline and compare it to a fixed voltage, and to stop the digital-to-analog converter from adding current to the bitline when the measured voltage exceeds the fixed voltage.

20 Claims, 7 Drawing Sheets

(51) Int. Cl.
*G11C 11/4094* (2006.01)
*H03K 17/22* (2006.01)
*G11C 11/406* (2006.01)
*G11C 5/02* (2006.01)
*G11C 11/4093* (2006.01)
*G01R 19/00* (2006.01)
*G01R 19/10* (2006.01)
*G05F 1/56* (2006.01)
*G05F 1/575* (2006.01)
*G11C 7/10* (2006.01)
*G11C 11/4097* (2006.01)

(52) U.S. Cl.
CPC .............. *G05F 1/561* (2013.01); *G05F 1/575* (2013.01); *G11C 5/025* (2013.01); *G11C 7/1096* (2013.01); *G11C 11/4074* (2013.01); *G11C 11/4091* (2013.01); *G11C 11/4093* (2013.01); *G11C 11/4094* (2013.01); *G11C 11/4097* (2013.01); *H03K 17/22* (2013.01)

(58) Field of Classification Search
CPC ............ G11C 11/4093; G11C 11/4094; G11C 11/4097; G01R 19/0038; G01R 19/10; G05F 1/561; G05F 1/575; H03K 17/22

USPC .................................................. 365/185.13
See application file for complete search history.

(56) References Cited

U.S. PATENT DOCUMENTS

| | | |
|---|---|---|
| 6,813,194 B2 | 11/2004 | Tran et al. |
| 8,547,756 B2 | 10/2013 | Widjaja et al. |
| 9,419,596 B2 | 8/2016 | Yang et al. |
| 10,062,327 B2* | 8/2018 | Tani ...................... G09G 3/3233 |
| 2006/0119496 A1 | 6/2006 | Tester et al. |
| 2010/0158055 A1 | 6/2010 | Giebel |
| 2010/0171774 A1* | 7/2010 | Mizukoshi ........... G09G 3/3275 |
| | | 345/690 |
| 2011/0115761 A1* | 5/2011 | Takei ..................... G09G 3/325 |
| | | 345/204 |
| 2016/0055791 A1* | 2/2016 | Kishi ....................... G09G 3/30 |
| | | 345/212 |
| 2019/0115077 A1 | 4/2019 | Shin et al. |

OTHER PUBLICATIONS

Non-Final Office Action issued in U.S. Appl. No. 16/932,258, dated Oct. 7, 2020.

\* cited by examiner

ANALOG-TO-DIGITAL CONVERTER FOR NON-VOLATILE MEMORY ARRAYS USED FOR IN-MEMORY COMPUTATION WITH FLOATING BITLINES

CROSS-REFERENCE TO A RELATED APPLICATION

This patent application claims the benefit of U.S. Provisional Application No. 62/875,066 filed Jul. 17, 2019, which is incorporated by reference.

BACKGROUND

Matrix of memory devices arranged in rows and columns may form a memory system used in variety of applications ranging from data storage to in-memory computation. Each memory device or cell may be a single element like a resistor, resistive memory, flash transistor, etc. or may include a combination of elements like 1T-1R memory cells. Each memory cell may be used to store a single bit of information or it may be used to store analog (multibit) values. The memory array may be called non-volatile if a non-volatile memory device like resistive-RAMs, PCM, flash, etc. is used in the memory cells to store data. The memory array may include multiple peripheral circuitries to properly bias memory devices inside the memory array during programming, read and/or operation. Different memory device types may be biased differently compared to each other and in different modes of operation (e.g. program, read, operation). Provided biases may bias the memory devices in different operating modes. For example, flash of floating-gate memory devices may be used subthreshold, triode (linear) or saturation regime. The memory array may be configured to also a include programming circuits and methodology through which memory devices may be programmed with analog or digital values. The array of memory cells may also be used for applications other than storage like in-memory computation where array of memory cells may be used to perform mathematical operations such as dot-product or vector-by-matrix multiplication using the data stored in memory cells. In such applications, the memory module may include some extra circuits like Analog-to-Digital Converter (ADC), Digital-to-Analog Converter (DAC), sense amplifier, current-to-voltage converter, etc. The memory array with non-volatile memory (NVM) cells may include circuitries to generate and route high-voltage signals needed to program the NVM cells.

In memory arrays used for data storage and retrieval or in-memory processing, there may be a need to measure multiple currents in parallel or to convert multiple analog currents generated by the memory devices within the memory array to digital. When the number of currents to be measured becomes large, it may not be possible or efficient to use multiple large, high-power ADCs to convert currents into voltage. Moreover, circuits designed for measuring small analog currents in sub-micron technologies may be bulky and sensitive to mismatches, device-to-device variations, process variations, etc. which may affect the precision of conversion. In such cases, the dependency of a bitline's voltage to the current being measured may be used to convert the analog current to digital using simpler circuits consuming less power and chip area while operating at higher speed.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

In one embodiment, a system with analog to digital converters is provided. The system may include a plurality of non-volatile memory cells that may be organized into an array having two or more rows of memory cells arranged horizontally and two or more columns of memory cells arranged vertically. The system may include a bitline electrically coupled to a column of memory cells vertically arranged in the array. The bitline may be configured to sum up the current produced by the memory cells in the column. The system may also include a digital-to-analog converter having an output that is electrically coupled to the bitline. The digital-to-analog converter may be configured to generate a current and add it through the output to the bitline. The system may further include a voltage comparator having an input that is electrically coupled to the bitline. The voltage comparator may be configured to measure a voltage on the bitline and compare it to a fixed voltage, and to stop the digital-to-analog converter from adding current to the bitline when the measured voltage exceeds the fixed voltage.

In some embodiments, the fixed voltage may be a voltage on the bitline during a read phase of programming.

In some embodiments, the digital-to-analog converter and the voltage comparator may be part of a first current measuring system and the system may include a second current measuring system that is electrically coupled to a second bitline.

In some embodiments, the first and second current measuring systems may be controlled together.

In some embodiments, the first and second current measuring systems may operate independently of each other.

In some embodiments, the comparator may be a low-gain amplifier.

In some embodiments, the memory cells may be flash or floating-gate transistors.

In some embodiments, the memory cells may be resistive switching devices.

In some embodiments, the system may be used for in-memory computing applications.

In some embodiments, the system may be used for data storage and retrieval applications.

In another embodiment, a method for for analog to digital converters for non-volatile memory arrays is provided. The method may include programming one or more non-volatile memory cells within an array to a target state. Each of the one or more non-volatile memory cells may be electrically coupled to a common bitline. The method may also include selecting one or more of the non-volatile memory cells within the array to receive input signals and connecting a current-output digital-to-analog converter to the bitline. The method may also include generating a current on the bitline and comparing the bitline voltage with a fixed voltage using a comparator having an input connected to the bitline. The method may also include increasing the current generated by the digital-to-analog converter on the bitline if the bitline voltage has not reached the fixed voltage and stopping the digital-to-analog converter from increasing current on the bitline if the bitline voltage has reached the fixed voltage.

In some embodiments, the method may also include determining, when the bitline voltage reaches the fixed voltage, that the current generated by the digital-to-analog converter is equal to the total current generated by the selected non-volatile memory cells at a read or operation condition.

In some embodiments, an output of the comparator may be switched to stop the digital-to-analog converter from increasing current on the bitline.

The object and advantages of the embodiments will be realized and achieved at least by the elements, features, and combinations particularly pointed out in the claims. Both the foregoing summary and the following detailed description are exemplary and explanatory and are not restrictive of the invention as claimed.

BRIEF DESCRIPTION OF THE DRAWINGS

Example embodiments will be described and explained with additional specificity and detail through the use of the accompanying drawings in which.

DETAILED DESCRIPTION

Figure 1:
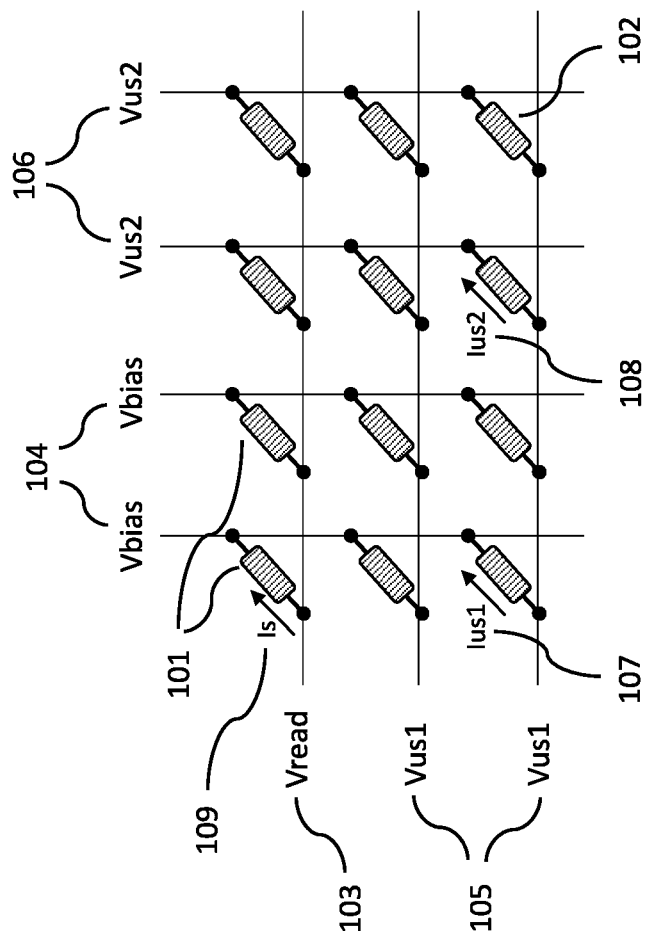
FIG. 1 illustrates an example of a memory system configured for reading device states.

One or more embodiments of the present disclosure may include a memory system including a matrix of non-volatile memory cells. Each memory cell may be a single element like a flash or floating-gate transistor or may consist of multiple elements creating more complicated structures like 1T-1R (one transistor, one resistive RAM). Binary or analog (multibit) values may be stored in each memory cells. Like other memory system, the memory array may be surrounded by other peripheral circuitries required for proper functionality of the memory system during, read, write or program, or operation modes. These peripheral circuits may include but are not limited to row and column decoders, sense amplifier, ADC, DAC, current to voltage converter, programming circuitry, biasing circuitry, charge pump, pulse generator, high-voltage and low-voltage routing circuitry, etc. The memory system may be used for data storage and retrieval application or may be used for more advanced applications like in-memory computation. During write or programming phase, single or multiple devices may be programmed to particular states by applying a single or a sequence of programming pulses. The programming pulses may have short or long duration and may have large or small amplitudes depending on the type of the memory cells used to create the memory arrays. During programming, proper voltages may be needed to be applied to other terminals of the memory devices. In read or operation mode, single or multiple memory devices in a single row or in multiple rows within the memory array may be activated or selected. Selected memory devices may produce a current proportional to the input signals applied to them and the states they are programmed to. The generated currents may then be summed up on the bitline wires which then may be measured and converted to digital for further processing. In memory application, multiple devices on a single row may be selected while in in-memory applications, like vector-by-matrix multiplication multiple, rows may be selected to be involved in the computation.

In some embodiments and during the programming of memory devices, the current state of the memory device may first be measured by biasing it with signals used during the read phase. In the read mode, that terminal of the memory cell electrically coupled with a bitline may be biased by a voltage Vbias used for device reading or for in-memory computation. If the current state of the device is not close enough to the target current, the memory system may be switched to the programming or write state and a single or a sequence of the pulses may be applied to the device to bring its state closer to the target state. The memory array may then be switched back to the read mode again to check the closeness of the device state to the target state. This process may be repeated until the maximum number of programming pulses is applied or the device state gets close enough to the target state. Now a memory device programmed to generate a current equal to Itarget when switched to read or operation mode may generate this current if and only if the voltage Vbias is applied to its bitline. This property may be used to simplify the ADC circuit used to measure and convert the bitline currents into digital.

In some embodiments, after programming all memory devices with target states, the memory array may be configured to be used in read or operation mode. In read or operation mode, multiple devices may be enabled or selected and may receive input signals. Activated memory devices may produce currents proportional to the received inputs and the states they are programmed to. Unselected devices may remain inactive producing zero or negligible currents. To measure the current generated by the selected memory devices and summed up on the bitlines, a current-output Digital-to-Analog Converter (DAC) connected to the bitline (BL) may start generating currents ranging from 0 to Imax where Imax may be the maximum current which may appear on the BL. The generated current may pass through the selected memory devices resulting in the increase of BL voltage. The BL voltage may reach a Vbias voltage if and only if the current generated by the DAC is equal to the sum of the currents generated by the selected memory devices. Therefore, a comparator comparing the BL voltage with Vbias may be used to notify the time the DAC current is equal to the sum of currents generated by memory devices and to stop the DAC from increasing its current further. The input digital code of the DAC circuit resulting in this current may be the digital representation of the sum of currents generated by memory devices. The proposed methodology of measuring analog currents in NVM arrays may have low power consumption and area due to the lack of any high-gain amplifier and may have very low sensitivity to device mismatch or process variations. Using long-channel memory devices may reduce the sensitivity to device mismatch or process variations even further.

In some embodiments, the system may include an array of memory devices arranged in rows and columns. Each memory cell may include a single or multiple non-volatile memory devices and may consist of multiple elements forming a complex structure. Some or all terminals of the memory devices located on a same row may be electrically coupled to each other. Some or all terminals of the devices located on the same column of the memory array may be electrically coupled together forming the bitlines of the memory. Currents of the activated memory devices located on the same column may be added up together and appear on the common bitline. There may be peripheral circuitries around the main memory to enable proper functionality of the memory array in write or programming, read or operation phase. These peripheral circuitries may include but not limited to charge pump, pulse generator, high- and low-voltage row and column decoders, biasing circuits, etc. These peripheral circuitries may be used to select a single or multiple devices in the memory array and read from or write to them one at a time or in parallel. Each memory device may operate in different regimes like subthreshold, triode (linear) or saturation in the case of flash or floating-gate devices. The NVM devices may be used to store analog (multibit) or binary values. The memory system may be used in variety of different applications like data storage and retrieval or in-memory computing. Rows and column decoders may route a vector of input signals to proper rows of the memory array and route bitlines of memory array to proper outputs.

In some embodiments, the memory cells may include a non-volatile device like a flash transistor, floating-gate transistor, Sonos transistor, resistive RAM, PCM, etc.

In some embodiments, the memory devices may have four (e.g. Gate, Drain, Source and substrate), or five (e.g. Gate, Drain, Source, Erase Gate, Substrate), or six (e.g. Gate, Control Gate, Drain, Source, Erase Gate, Substrate) terminals.

In some embodiments, a single or a set of memory devices may be selected to be programmed through a row and column decoders. A single or a sequence of programming pulses may be applied to the selected devices to program them to the desired state or to bring their state closer to the desired state. The pulse duration and the amplitude of the programming pulses may depend on the type of NVM device used as memory device. After each or a set of programming pulses, the memory array may be switched to the read or operation mode where the new states of the memory devices may be checked to see whether they have reached close enough to the desired states. In the read or operation mode, the selected NVM devices may be biased with the read biases and the bitlines may be biased with a read voltage Vbias. Each selected memory device may produce a current proportional to its biasing condition, applied input signal, voltage on the bitline, and the current state of the device. If the produced current of a particular device is close enough to the desired current, the programming may be stopped. Otherwise the procedure may be repeated until the stopping conditions are met. Terminals of the selected and unselected devices within the memory array may need to be biased with proper voltages in programming mode.

In some embodiments, proper voltages may be applied to terminals of the unselected memory devices in the memory array to prevent them from getting programmed when the array is in the programming mode or to prevent them from generating any noticeable current when the array is in the read or operation mode.

In some embodiments, the memory array may be used for data storage and retrieval application. In this application, the row decoder may activate multiple devices on a specific row and the selected devices may produce currents on their corresponding bitlines proportional to the state they have been programmed to. In some other embodiments, the memory array may be used for in-memory application. The row decoder or other circuitry may apply a vector of analog or digital input signals to the selected rows of the memory array. Memory devices receiving these input signals may produce currents on their corresponding bitlines proportional to the amplitude or width of the received input signals and their programmed states. Currents of different devices connected to the same bitline may be summed up on the bitlines. Based on the type of devices used in memory cells, there may be a need for a biasing circuitry to bias different terminals of the selected and unselected devices with different voltages. Different sets of voltages may be used to bias the selected and unselected devices within the memory array during the read and write operations.

In some embodiments, pairs of memory devices may form a supercell structure where they share their source terminals to reduce layout area of the memory array.

In some embodiments, the memory system may also include a Current Measuring System (CMS) which may receive an analog input current from the bitline it is connected to and convert that analog signal into its corresponding digital representation. The CMS may act as an ADC. The CMS may include a current-output DAC and a comparator. Each bitline of the memory array may be connected to a separate CMS circuit converting analog currents generated by memory devices on the bitlines to their digital representation in parallel. The CMS may work at different precisions and therefore different speeds determined mainly by the precision of the internal DAC.

When inputs are applied to the selected memory devices within the memory array, the bitlines may be left unbiased by connecting the output of the DACs to their corresponding bitlines. Unbiasing bitlines may prevent selected memory devices from generating any current. Each bitline is also connected to the input of the voltage comparator which may compare the bitline voltage with a Vbias voltage (i.e. a voltage on the bitline during the read phase of programming). To measure the currents on each bitline at operation mode, the DAC may start generating analog currents which may pass through selected memory devices connected to the same bitline. By the increase of the current generated by the DAC, the voltage on the bitline may rise. When the voltage on the bitline reaches Vbias, the comparator's output may switch indicating that the current generated by the DAC is equal to the sum of currents of selected devices in read mode (i.e. when bitlines are biased with a fixed Vbias voltage). The switching of the comparator may stop the DAC's current from increasing more and the last input digital signal applied to the input of the DAC and resulted in the switching of the comparator's output may be the digital representation of the bitline current (result of the conversion from analog to digital).

In some embodiments, NVM devices which their currents have less sensitivity to the bitline voltage may be used to reach faster and more accurate analog to digital conversion of bitline current.

In some embodiments, in memory arrays using flash or floating-gate memory devices, transistors with longer channels may be used to reduce the dependency of channel current to bitline voltage.

In some other embodiments, in memory arrays using flash or floating-gate memory devices, transistors may be biased in subthreshold to reduce the dependency of channel current to bitline voltage.

In some other embodiments, in memory arrays using flash or floating-gate memory devices, transistors may be programmed to states close to fully programmed to reduce the dependency of channel current to bitline voltage.

In some embodiments, reducing the dependency of a memory device's channel current to bitline voltage may allow comparators to have larger input offsets and therefore consume less area.

In some embodiments, the digital input signals of DACs may be shared. In other embodiments, DACs may work independently.

Different DACs with different architectures may be used to generate the currents. To generate a current from 0 to Imax (or from Imin to Imax), an N bit DAC may sequentially generate $2^N$ different currents, one slightly larger than the previous one. Other DAC architectures like binary search, binary weighted, current steering may be used to speed up the conversion process (e.g. to reduce it to N steps).

In some embodiments, the presented architecture may reduce the power consumption of the analog-to-digital converter by avoiding the usage of power-hungry operational amplifiers. It may also reduce the chip area by reducing the sensitivity of the circuit's accuracy to device mismatches and process variations.

These and other embodiments of the present disclosure will be explained with reference to the accompanying figures. In the figures, features with like numbers indicate like structure and function unless described otherwise.

FIG. 1 illustrates an example of a memory array configuration for device state verification after the application of a single or a sequence of programming pulses. The memory array may include a matrix of NVM devices 101 and 102 arranged in rows and columns. The memory devices may have multiple terminals depending on a type of the NVM device used in the memory array. There may be multiple peripheral circuits around the memory array managing the functionality of the memory in different modes like read, write or operation. Each memory array or a set of memory arrays may be selected for being programmed with binary and analog (multibit) values. A single or a sequence of programming pulses may be applied to the selected devices to program their state with the predetermined values. After the application of pulses, the states of selected devices may be checked to see whether further pulses are needed or not. Memory devices 101 may be selected for reading by applying proper voltages to their terminals. Voltage Vread 103 may be applied to the horizontal wires and voltage Vbias 104 may be applied to the vertical wires of the selected devices. Other terminals of the memory array may be biased with voltages like Vus1 105 and Vus2 106. These voltages may bias the unselected memory devices 102 such a way that they may produce zero or negligible currents. The exact values of these Vus1 and Vus2 voltages may depend on the memory device characteristics, and the value of voltages Vbias and Vread. More voltages may be applied to selected or unselected memory devices with more terminal to bias them in read or off conditions. The biasing scheme during device state verification may reduce the current of unselected devices Ius1 (107) and Ius2 (108) to zero so the current on each bitline may only be the current of the selected memory devices Is (109). These currents may be measured and verified with any circuits like ADCs. If the current of selected devices are still far away from the desired currents, a new set of programming pulses may be applied to them to bring them closer to the desired state. The process may be repeated until all the selected devices are programmed with acceptable accuracy.

Figure 2:
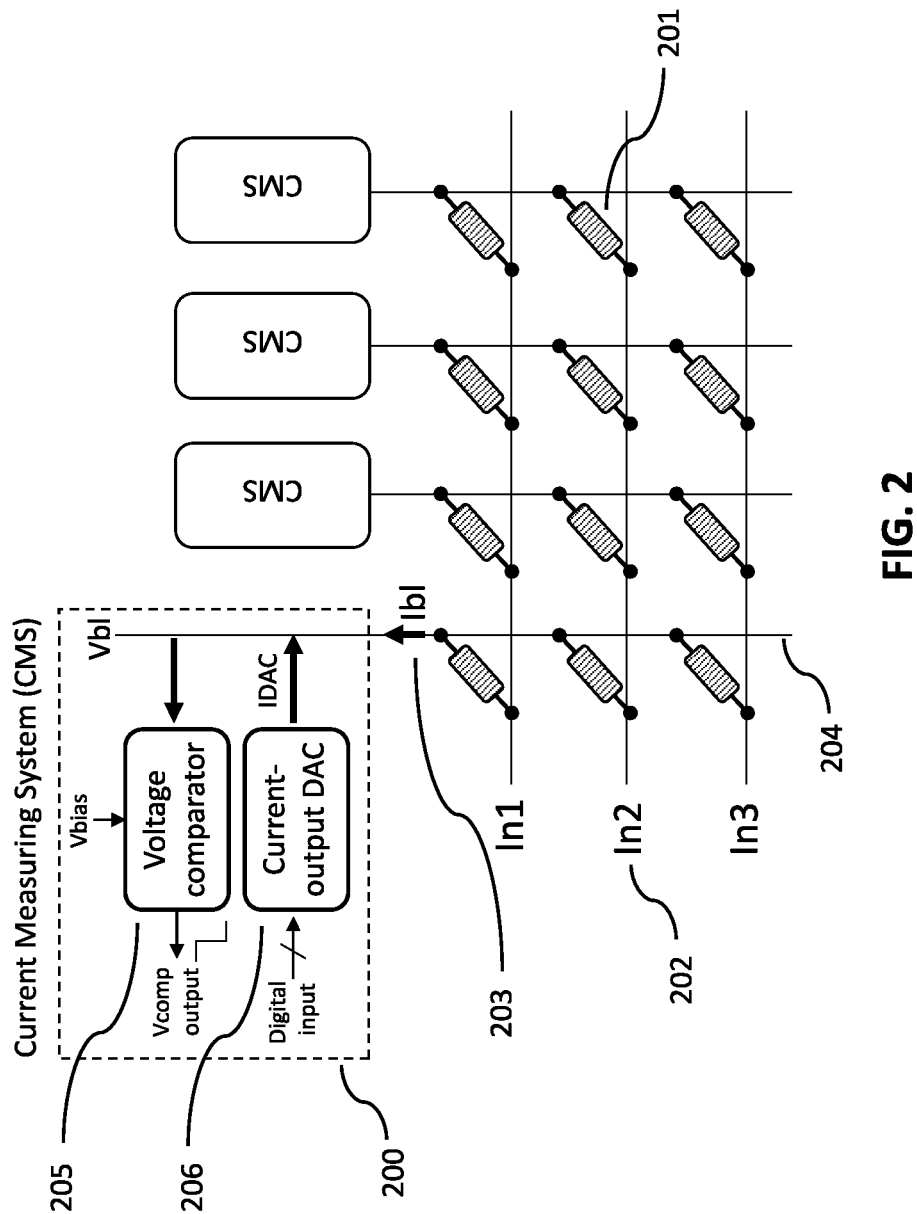
FIG. 2 illustrates an example of an ADC measuring the output currents of the memory system in read/operation mode.

FIG. 2 illustrated the already programmed memory array of FIG. 1 in operation mode. Memory devices 201 may be selected for operation by applying proper voltages to their terminals. During operation, a vector of input signals 202 may be applied to the selected rows of the memory array. For in-memory computing applications, these signals may be the vector of analog or digital signals. In data storage applications, one or multiple rows of the memory array may be selected using the row decoders for data retrieval. Each selected memory device may produce a current proportional to the amplitude or width of the received input, voltage bias of bitlines and the state it is programmed to. These generated currents may be summed up on the common bitlines 204 forming a combined current Ibl 203. The current 203 may then be measured and converted to digital using the Current Measuring System (CMS) 200.

The CMS circuit 200 may include a current-output DAC 206 and a voltage comparator 205. Output of the current-output DAC 206 and the input of the voltage comparator 205 may be connected to the bitline. The voltage comparator 205 may compare the voltage on the bitline with a fixed voltage Vbias and switch its output sign whenever one gets higher or lower than the other one. For each measurement of the output current of the memory array during operation, the current-output DAC 206 may start by generating a smallest possible current and step by step increase the generated currents. The amplitude of each step depends on the resolution of the DAC. Finer steps may be generated using DACs with higher resolutions. The current generated by the DAC (IDAC) may pass through the selected devices sharing the same bitline. The passage of current may increase the bitline voltage Vbl. As soon as the bitline voltage Vbl passes Vbias, the output of the comparator may switch stopping the DAC from increasing its current further. The last digital input applied to the DAC switching the sign of the comparator output may be the digital representation of the bitline current generated by memory devices of the memory array when bitline voltage is equal to Vbias.

In some embodiments, different DAC circuits with different architectures may be used for the implementation of 206. This may include but not limited to DAC architectures like binary search, current steering, binary weighted, etc. . . . . Some of these DAC architectures may reduce the number of steps by which the DAC current may be incremented from $2^N$ to N where N is the resolution of the DAC in bits.

In some embodiments, different circuits with different architectures may be used for the implementation of the comparator 205. Low-gain amplifiers may be used to implement the comparator to reduce its power consumption.

Allowing the bitlines to fluctuate may remove the need for high-gain operational amplifiers to constantly keep the Vbias voltage on bitlines, reducing the power consumption and chip area of the system considerably.

In some embodiments, dependency of memory device current to bitline voltage may be reduced to increase the accuracy of converting bitline analog current to digital. For example, flash or floating-gate transistors with longer channels may be used to reduce the impact of bitline voltage.

In some embodiments using flash or floating-gate transistors as memory devices, transistors may be biased in subthreshold to reduce the dependency of device current to bitline voltage which may increase the accuracy of conversion.

In some embodiments, different CMS circuits connected to different bitlines may be controlled together. In some other embodiments, these CMS circuits may operate independent from one another. CMS of unselected bitlines may be turned off to save power.

Figure 3:
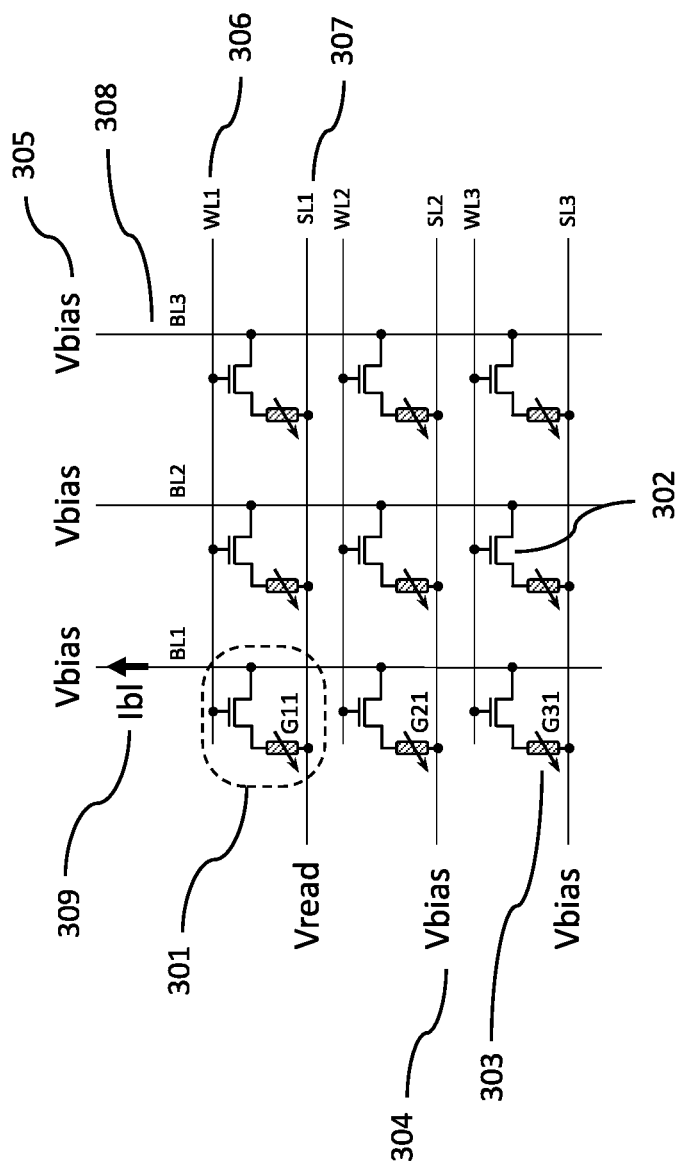
FIG. 3 illustrates an example of a memory system consisting of resistive RAM memory devices configured for reading device states.

FIG. 3 illustrates an example of memory array configured for the verification of the states of the selected devices after programming where memory devices are resistive switching elements. Each memory device 301 may consist of a non-volatile resistive switching element 303 like a PCM, memristor, resistive RAM, etc. which its resistance can be programmed through the application of programming signals. The memory cells may have an optional selector device 302 connected in series with the resistive switching device 303 facilitating the selected and deselection of individual memory cells inside the memory array. Devices on each row may be selected by applying a high voltage on a corresponding WL 306. Setting the gate of pass transistors 302 by applying a low voltage to the corresponding WL may deselect the devices on that row. The other terminal of the resistive switching elements on each row may share a common line called SL (307) where input signals 304 may also be applied to. Memory cells located on the same columns of the memory array may share a common bitline 308 through which their current may be measured.

To verify the state or read current of each programmed memory device, A Vread voltage may be applied to the SL of the selected devices while the WL of the row is set to high. The other rows and all the column (BLs) may be biased with Vbias (305). This biasing scheme may set the current in most of the unselected devices to zero. On the bitlines connected to the selected devices, the current Ibl may be just the current of the selected memory devices biased in read condition. This current may be equal to the conductance of the memory device (G) multiplied by the voltage dropped on the device (e.g. Vread-Vbias). If the current is not close enough to the desired current, the array may be configured again to the programming mode and a new set of programming pulses may be applied to the selected devices.

Figure 4:
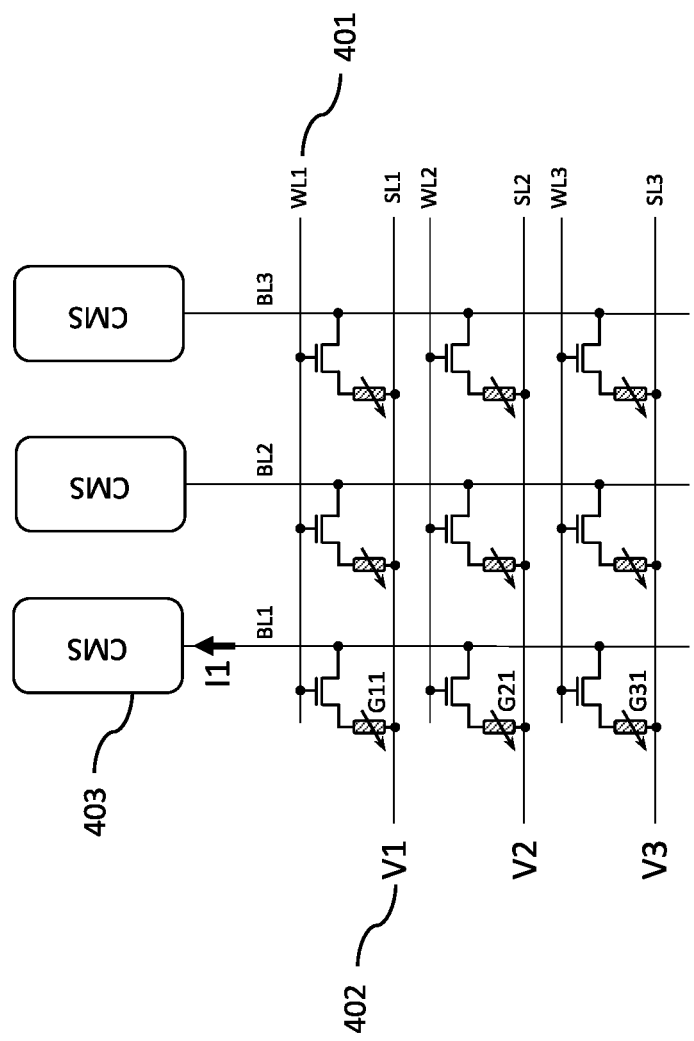
FIG. 4 illustrates an example of ADCs measuring the output currents of the memory system with resistive RAM memory devices in read/operation mode.

FIG. 4 illustrates how CMS circuits 403 may be used with a memory array of resistive switching devices to read the output currents of the array in read and/or operation mode and convert it to digital. Different rows of the memory array may be selected for by setting the corresponding WLs 401 to high. A vector of analog or digital input signals 402 may be applied to the SLs of the memory array. The CMS circuits 403 connected to BLs may then measure the current on BLs and convert them to their corresponding digital representation.

Figure 5:
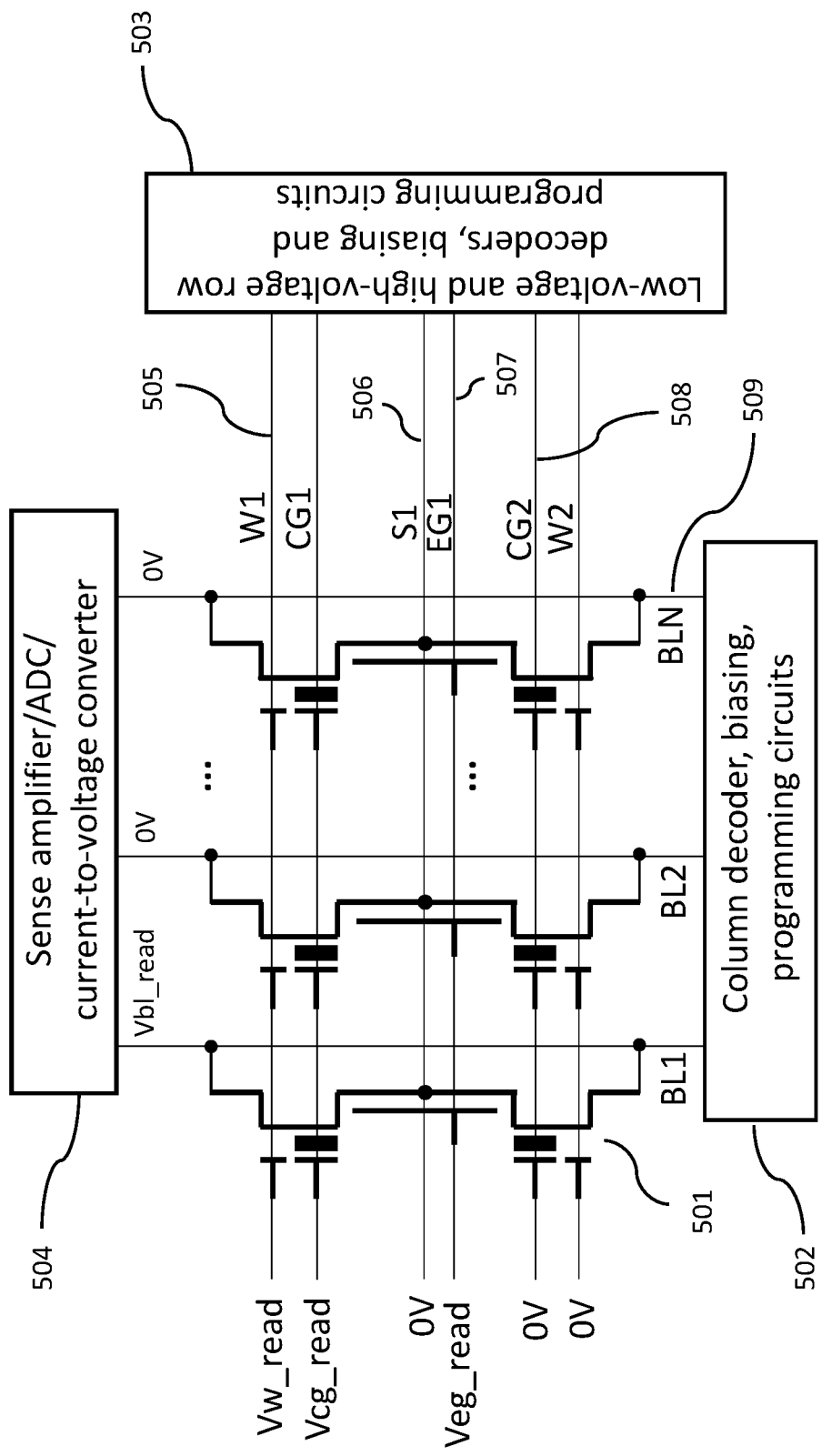
FIG. 5 illustrates an example of a memory system consisting of flash or floating-gate memory devices configured for reading device states.

FIG. 5 illustrates an example of memory array configured for the verification of the states of the selected devices after programming where memory devices are flash or floating-gate transistors. Each flash memory transistor 501 may have multiple terminals like WL (505), CG (508), SL (506), EG (507) and BL (509) besides the substrate. Memory devices located on the same row may share WL, CG, SL, and EG while BLs are shared between memory devices located on the same column. Every two nearby memory devices may share the SL and EG forming a structure known as supercell. The memory array may be connected to multiple peripheral circuitries enabling proper operation of the memory array in read, write/programming and operation modes. These peripheral circuitries may include but not limited to column decoder and biasing circuits 502, low- and high-voltage row decoders and programming circuits 503, and sense amplifier, ADCs, and current to voltage converters 504. The state of any device within the memory array may be verified after the application of a set of programming pulses by first selecting the device through the application of Vw_read, Veg_read and Vcg_read to its WL, EG and CG terminals respectively while keeping the SL at ground. Other devices on the shared BL may be deselected by applying zero to their CG and/or WL. Unselected devices on other columns may also be unselected by setting the voltage of their BL to zero. The current of the selected transistor may be measured by setting the BL of the selected transistor to Vbias. Different set of voltages may be applied to the memory array to bias the transistors for the read purpose.

Figure 6:
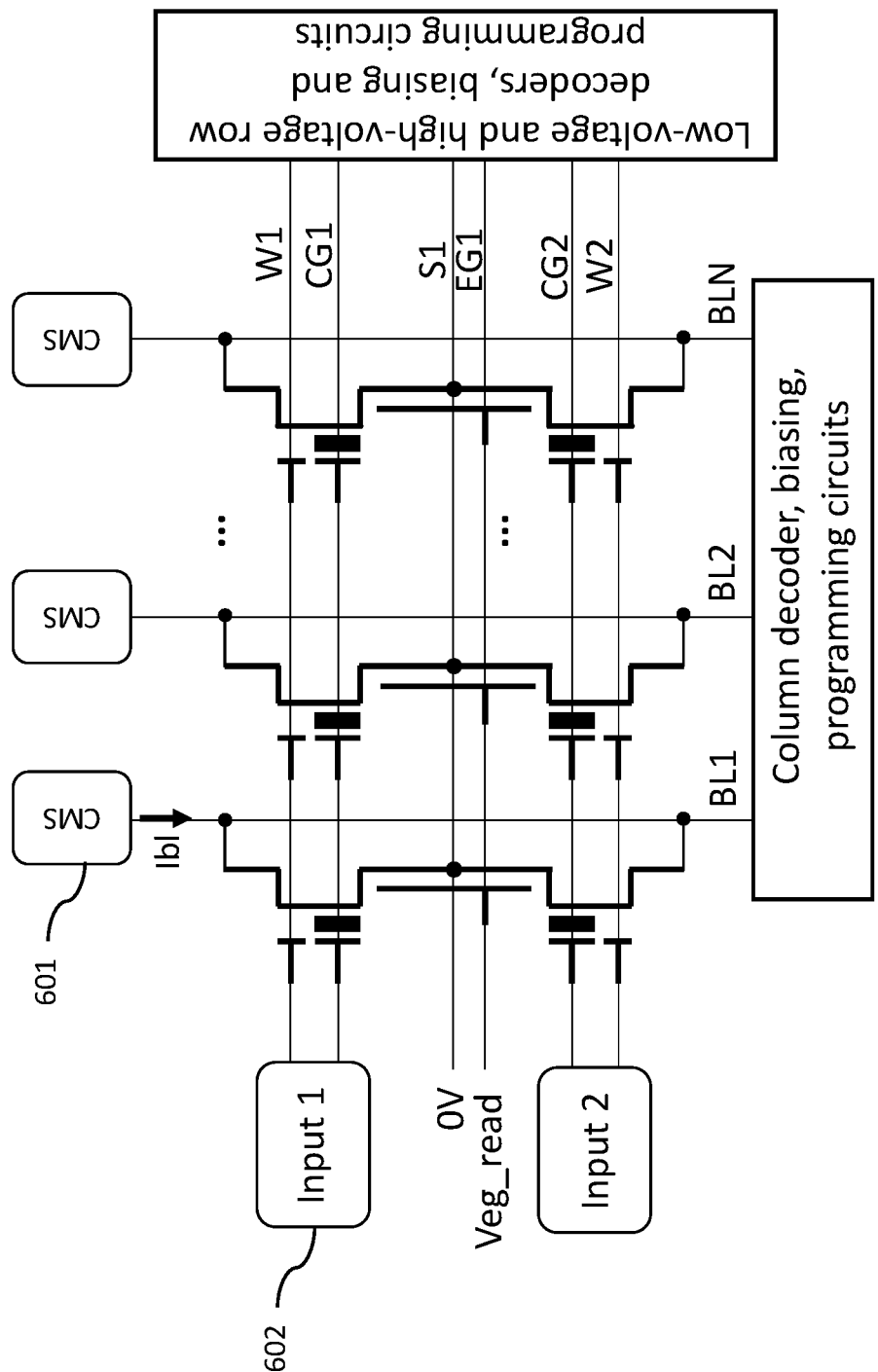
FIG. 6 illustrates an example of ADCs measuring the output currents of the memory system with flash or floating-gate memory devices in read/operation mode.

FIG. 6 illustrates how CMS circuits 601 may be used with a memory array of flash or floating-gate transistor devices to read the output currents of the array in read and/or operation mode and convert it to digital. Proper voltages may be applied to WL or CG to select the rows involved in the operation (or reading). Unselected rows of the memory array may be deselected by applying low voltages on CG or WL. SL and EG of the rows involved in the operation may be biased by 0 and Veg_read respectively. WL or CG of the selected devices not used for the selection of the row may receive an analog or a digital input signal 602. Selected devices on each column receiving input signals may generate currents proportional to the input signal and, voltage bias applied to BL, and the state they are programmed to. CMS circuits 601 connected to BLs may be used to read the sum of memory device currents on BLs and convert it into their corresponding digital representations.

In some embodiments, different flash transistors with different number of terminals and functionalities may be used to construct a memory array. In some other embodiments, the nearby flash transistors may have separate EGs and SLs.

In some other embodiments, flash memory devices may be used in different configurations to form the memory array.

In this or other embodiments, current of the selected transistor may be read from the source lines instead of bitlines.

Figure 7:
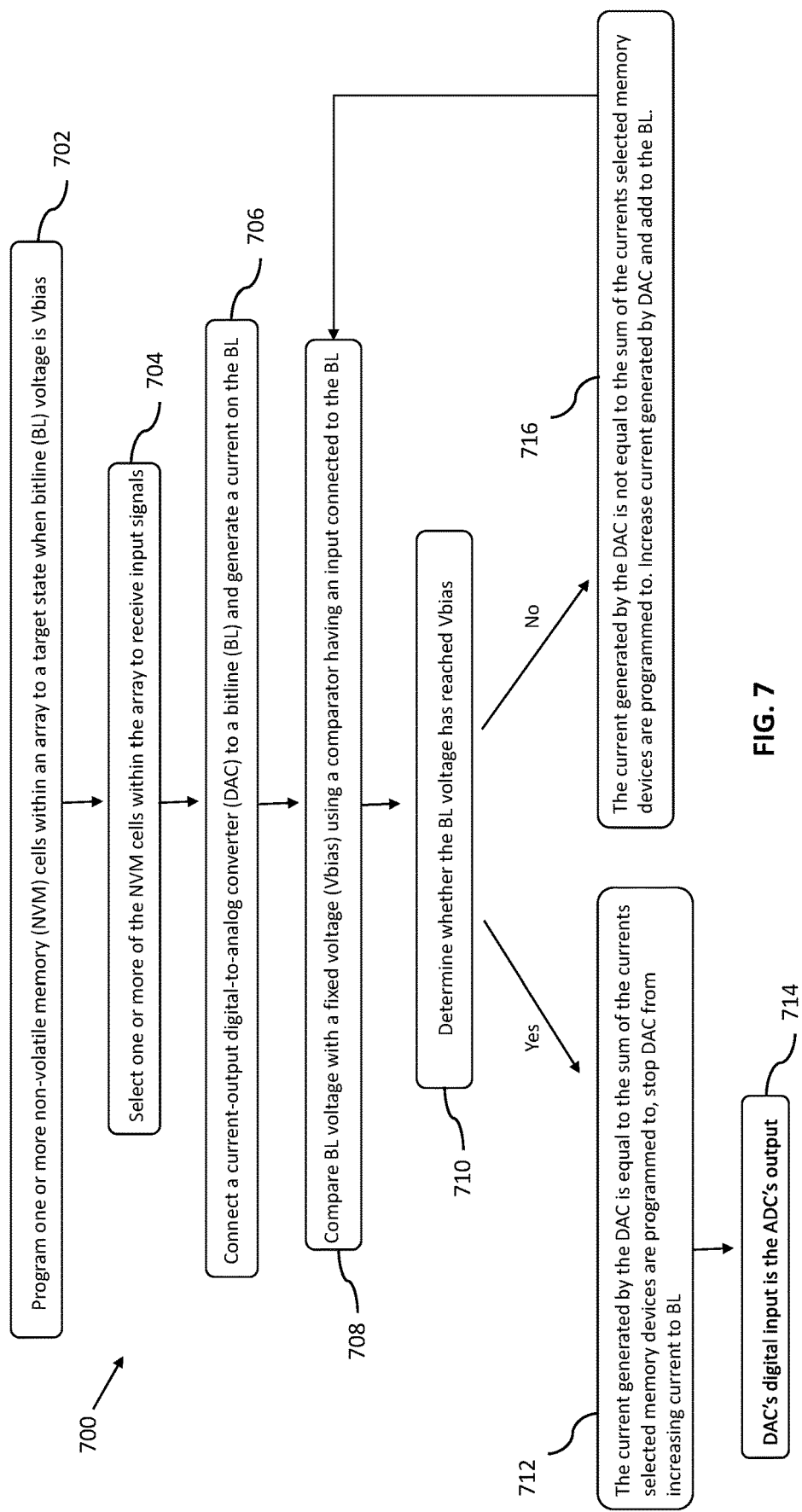
FIG. 7 is a flowchart of an example method for analog to digital converters for NVM arrays to read out the analog currents generated by the memory devices within the memory array during read or operation mode.

FIG. 7 is a flowchart of an example method 700 for analog to digital converters for NVM arrays to read out the analog currents generated by the memory devices within the memory array during read or operation mode. The method may include, at action 702, programming one or more non-volatile memory (NVM) cells within an array to a target state. In this stage, selected devices inside the memory array may be programmed to generate predetermined analog currents when biased with particular biasing conditions identical to those used in read or operation mode. The bitline (BL) of the selected columns may be biased with Vbias when the states of memory devices are verified after the application of each set of programming pulses.

The method may include, at action 704, selecting one or more of the NVM cells within the array to receive input signals. Based on the application, single or multiple rows of the memory array may be selected to receive digital or analog signals when configured for read or operation mode. Selected memory devices may produce the same currents they are programmed to at action 702 if their BLs are biased with Vbias. The BLs of the selected columns may be left floating.

The method may include, at action 706, connecting a current-output digital-to-analog converter (DAC) to a bitline (BL) and generating a current on the BL. The DAC may produce a current proportional to the digital code it receives. It may start by generating the smallest current and which may be then increased step by step. The current generated by the DAC may pass through the selected memory devices sharing the same BL. The portion of the DAC current which may pass through each of the selected and activated memory devices may depend on the device state and the input it receives.

The method may include, at action 708, comparing the BL voltage with a fixed voltage (Vbias) using a comparator having an input connected to the BL. A comparator connected to the BL may monitor the BL voltage and switch its output when the BL voltage passes the fixed voltage Vbias. The switching of the comparator output may stop the DAC output current from further increasing.

The method may include, at action 710, determining whether the BL voltage has reached Vbias. When the BL voltage reaches the Vbias, the current generated by the DAC may be equal to the total current generated by the selected devices at the read or operation condition when BL voltage is Vbias.

The method may include, at action 712, if the current generated by the DAC is equal to the sum of the currents selected memory devices are programmed to, stopping the DAC from increasing current to BL and at action 714 DAC's digital input is the ADC's output. If the BL voltage reaches Vbias, the output of the comparator may switch stopping the DAC output current from increasing further. At this stage, the last digital input code applied to the DAC may be the digital representation of the total current generated by the selected memory devices on the BL.

Alternatively, if the current generated by the DAC is not equal to the sum of the currents selected memory devices are programmed to, the method may include, at action 716, increasing the current generated by DAC and adding that current to the BL. Steps 708 and 710 may then be repeated until the current generated by the DAC is equal to the sum of the currents generated by the selected memory devices.

In accordance with common practice, the various features illustrated in the drawings may not be drawn to scale. The illustrations presented in the present disclosure are not meant to be actual views of any particular apparatus (e.g., device, system, etc.) or method, but are merely example representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the summary, detailed description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

The foregoing description, for purpose of explanation, has been described with reference to specific embodiments. However, the illustrative discussions above are not intended to be exhaustive or to limit the invention as claimed to the precise forms disclosed. Many modifications and variations are possible in view of the above teachings. The embodiments were chosen and described to explain practical applications, to thereby enable others skilled in the art to utilize the invention as claimed and various embodiments with various modifications as may be suited to the particular use contemplated.

The invention claimed is:

1. A system with analog to digital converters, the system comprising:
   a plurality of non-volatile memory cells, wherein the memory cells are organized into an array having two or more rows of memory cells arranged horizontally and two or more columns of memory cells arranged vertically,
   a bitline electrically coupled to a column of memory cells vertically arranged in the array, wherein the bitline is configured to sum up the current produced by the memory cells in the column;
   a digital-to-analog converter having an output that is electrically coupled to the bitline, wherein the digital-to-analog converter is configured to generate a current and add it through the output to the bitline; and a voltage comparator having an input that is electrically coupled to the bitline, wherein the voltage comparator is configured to measure a voltage on the bitline and compare it to a fixed voltage, and to stop the digital-to-analog converter from adding current to the bitline when the measured voltage exceeds the fixed voltage.

2. The system of claim 1, wherein the fixed voltage is a voltage on the bitline during a read phase of programming.

3. The system of claim 1, wherein the digital-to-analog converter and the voltage comparator are part of a first current measuring system and wherein the system includes a second current measuring system that is electrically coupled to a second bitline.

4. The system of claim 3, wherein the first and second current measuring systems are controlled together.

5. The system of claim 3, wherein the first and second current measuring systems operate independently of each other.

6. The system of claim 1, wherein the comparator is a low-gain amplifier.

7. The system of claim 1, wherein the memory cells are flash or floating-gate transistors.

8. The system of claim 1, wherein the memory cells are resistive switching devices.

9. The system of claim 1, wherein the system is used for in-memory computing applications.

10. The system of claim 1, wherein the system is used for data storage and retrieval applications.

11. A method for analog to digital converters for non-volatile memory arrays, the method comprising:
    programming one or more non-volatile memory cells within an array to a target state, wherein each of the one or more non-volatile memory cells are electrically coupled to a common bitline;
    selecting one or more of the non-volatile memory cells within the array to receive input signals;
    connecting a current-output digital-to-analog converter to the bitline;
    generating a current on the bitline;
    comparing the bitline voltage with a fixed voltage using a comparator having an input connected to the bitline;
    increasing the current generated by the digital-to-analog converter on the bitline if the bitline voltage has not reached the fixed voltage; and
    stopping the digital-to-analog converter from increasing current on the bitline if the bitline voltage has reached the fixed voltage.

12. The method of claim 11 further comprising determining, when the bitline voltage reaches the fixed voltage, that the current generated by the digital-to-analog converter is equal to the total current generated by the selected non-volatile memory cells at a read or operation condition.

13. The method of claim 11, wherein an output of the comparator is switched to stop the digital-to-analog converter from increasing current on the bitline.

14. The method of claim 11, wherein the fixed voltage is a voltage on the bitline during a read phase of programming.

15. The method of claim 11, wherein the one or more non-volatile memory cells are part of an array and are arranged horizontally in a common column.

16. The method of claim 15, wherein the array is used for in-memory computing applications.

17. The method of claim 15, wherein the array is used for data storage and retrieval applications.

18. The method of claim 11, wherein the comparator is a low-gain amplifier.

19. The method of claim 11, wherein the memory cells are flash or floating-gate transistors.

20. The method of claim 11, wherein the memory cells are resistive switching devices.

* * * * *